US009779192B2

(12) United States Patent
McGaughy et al.

(10) Patent No.: US 9,779,192 B2
(45) Date of Patent: Oct. 3, 2017

(54) MULTI-RATE PARALLEL CIRCUIT SIMULATION (71) Applicant: PROPLUS ELECTRONICS CO., LTD., Jinan (CN)

(72) Inventors: Bruce W. McGaughy, Pleasanton, CA (US); Zhenzhong Zhang, Beijing (CN); Jun Fang, Beijing (CN)

(73) Assignee: PROPLUS DESIGN SOLUTIONS, INC., San Jose, CA (US)

( * ) Notice: Subject to any disclaimer, the term of this patent is extended or adjusted under 35 U.S.C. 154(b) by 633 days.

(21) Appl. No.: 14/332,265

(22) Filed: Jul. 15, 2014

(65) Prior Publication Data
US 2015/0363527 A1 Dec. 17, 2015

(51) Int. Cl.
*G06F 17/50* (2006.01)

(52) U.S. Cl.
CPC ...... *G06F 17/5036* (2013.01); *G06F 17/5009* (2013.01)

(58) Field of Classification Search
CPC .............................. G06F 9/54; G06F 17/5022
USPC ........................................... 719/310; 703/14
See application file for complete search history.

(56) References Cited

U.S. PATENT DOCUMENTS

| 5,541,861 | A  | * | 7/1996 | Komoda | G06F 17/5022 703/15 |
| 9,031,825 | B1 | * | 5/2015 | McGaughy | G06F 17/5022 703/14 |
| 2002/0011885 | A1 | * | 1/2002 | Ogawa | G06F 17/5036 327/158 |
| 2007/0157135 | A1 | * | 7/2007 | Yang | G06F 17/5036 716/111 |
| 2011/0029299 | A1 | * | 2/2011 | Zhu | G06F 17/5022 703/14 |
| 2015/0317417 | A1 | * | 11/2015 | Fang | G06F 17/5036 703/2 |

FOREIGN PATENT DOCUMENTS

DE 10106247 A1 * 10/2002 ......... G06F 17/5036

OTHER PUBLICATIONS

Bruce Hendrickson, Graph Partitioning models for parallel computing, Sep. 1999.*

* cited by examiner

*Primary Examiner* — Lechi Truong
(74) *Attorney, Agent, or Firm* — Silicon Valley Patent Group LLP; Thomas C. Chan (57) ABSTRACT

Methods and systems are disclosed related to multi-rate parallel circuit simulation. In one embodiment, a computer implemented method of partitioning the circuit into a plurality of partitions, wherein each partition is represented by a set of linear differential equations, determining a simulation time step for each partition of the plurality of partitions, grouping the plurality of partitions into multiple groups, wherein each group includes one or more partitions having simulation time steps within a predefined range of each other, and solving the multiple groups with their corresponding simulation time steps in parallel.

19 Claims, 7 Drawing Sheets

MULTI-RATE PARALLEL CIRCUIT SIMULATION

CROSS-REFERENCE TO PRIORITY APPLICATION FILED IN CHINA

This patent application claims priority from Chinese Application No. 201410260639.3 filed in The State Intellectual Property Office of the People's Republic of China on Jun. 16, 2014, which is incorporated by reference herein in its entirety.

FIELD

The present invention relates to the field of electronic design automation tools. In particular, the present invention relates to multi-rate parallel circuit simulation.

BACKGROUND

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc.

The development of complicated integrated circuits often requires the use of powerful numerical simulation programs. For example, circuit simulation is an essential part in the design flow of integrated circuits, helping circuit designers to verify the functionality and performance of their designs without going through expensive fabrication processes. As the semiconductor processing technology migrates to nanometer dimensions, new simulation methodologies are needed to solve the new problems intrinsically existing in circuit design with nanometer features. Modern integrated circuits continually challenge circuit simulation algorithms and implementations in the development of new technology generations. The semiconductor industry requires EDA software with the ability to analyze nanometer effects like coupling noise, ground bounce, transmission line wave propagation, dynamic leakage current, supply voltage drop, and nonlinear device and circuit behavior, which are all related to dynamic current. Thus, detailed circuit simulation and transistor-level simulation have become one of the most effective ways to investigate and resolve issues with nanometer designs.

Examples of electronic circuit simulators include the Simulation Program with Integrated Circuit Emphasis (SPICE) developed at the University of California, Berkeley (UC Berkeley), and various enhanced versions or derivatives of SPICE. SPICE and its derivatives or enhanced versions will be referred to hereafter as SPICE circuit simulators, or SPICE. The SPICE method considers a circuit as a non-divided object.

SPICE-like simulations may provide fairly accurate predictions of how corresponding circuits will behave when actually built. The predictions are preferably made not only for individual sub-circuit but also for whole systems (e.g., whole integrated circuits) so that system-wide problems relating to noise and the like may be uncovered and dealt with. In a general process flow of a SPICE-like simulation, an analog integrated circuit under simulation is often represented in the form of a netlist description. A netlist is a circuit description of the analog circuit to be simulated written in a SPICE-like language. SPICE netlists are pure structural languages with simulation control statements. Other language like Verilog-A™ has the capability to include behavioral constructs. The structural netlist of SPICE together with a predefined set of circuit components of the analog integrated circuit may be represented in the form of a matrix in accordance with certain circuit modeling methodologies (which is not a concern of the present disclosure). The number of non-linear differential equations ranges from 1 to n. There are a corresponding number of input vectors to be operated by the linear equation. The set of input vectors are shown as $\{I_1, I_2, \ldots I_n\}$. Next, the linear matrix is computed with the set of input vectors to generate a set of solution vectors $\{V_1, V_2, \ldots V_n\}$. The computation is repeated until the set of solutions converge. The set of solutions may be then displayed in the form of waveforms, measurements, or checks on a computer screen for engineers to inspect the simulation results.

However, SPICE-like simulation of a whole system becomes more difficult and problematic as the industry continues its relentless trek of scaling down to smaller and smaller device geometries and of cramming more interconnected components into the system. An example of such down scaling is the recent shift from micron-sized channels toward deep submicron sized transistor channel lengths. Because of the smaller device geometries, a circuit designer are able to cram exponentially larger numbers of circuit components (e.g., transistors, diodes, capacitors) into a given integrated circuit (IC), and therefore increases the matrix size to a complexity which may not be solved in a desired time frame.

A circuit may be represented as a large numerically discrete nonlinear matrix for analyzing instant current. The matrix dimension is of the same order as the number of the nodes in the circuit. For transient analysis, this giant nonlinear system needs to solve hundreds of thousand times, thus restricting the capacity and performance of the SPICE method. The SPICE method in general can simulate a circuit up to about 50,000 nodes. Therefore it is not practical to use the SPICE method in full chip design. It is widely used in cell design, library building, and accuracy verification.

With some accuracy lost, the Fast SPICE method developed in the early 1990s provides capacity and speed about two orders of magnitude greater than the SPICE method. The performance gain was made by employing simplified models, circuit partition methods, and event-driven algorithms, and by taking advantage of circuit latency.

SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal I; $V_j$ (j=1, n) represents the voltage or terminal bias across terminal j and a reference terminal, such as the ground; and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$$Q_i = q_i(V_1, \ldots, V_n, t) \text{ for } i=1, \ldots, n.$$

where $Q_i$ represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

Solving a matrix can be very time consuming when the matrix size become very large for a nanometer design, as the computational cost is in the order of $n^3$, where n is the size of the matrix. During circuit simulation, the total simulation time T is proximately equal to $$T \approx \Sigma \text{Timestep}_i \times \text{Time}_{solve}^i$$

Where, $\text{Timestep}_i$ is the length of each time step, $\text{Time}_{solve}^i$ is solve time spent on time step i. In general the smaller the time steps, the more accurate the simulation. However, unnecessary small time steps can slow down the simulation, while a larger time step can lead to slower convergence as more iteration has to be taken to reach a converged solution. In practice, the time step has to be optimized to tradeoff between accuracy and total simulation time. When circuit simulation is used for statistical analysis, it can increase the total simulation time to be the product of total number of seeds and the corresponding simulation time spent on each seed. For a typical Monte-Carlo analysis, it can take more than a thousand simulations (seeds) to reach a converged solution.

Therefore, there is a need for methods and systems that address the issues of the conventional simulation systems described above.

SUMMARY

Method and system related to multi-rate parallel circuit simulation are disclosed. In one embodiment, a computer implemented method of partitioning the circuit into a plurality of partitions, wherein each partition is represented by a set of linear differential equations, determining a simulation time step for each partition of the plurality of partitions, grouping the plurality of partitions into multiple groups, wherein each group includes one or more partitions having simulation time steps within a predefined range of each other, and solving the multiple groups with their corresponding simulation time steps in parallel.

In another embodiment, An apparatus configured to perform multi-rate circuit simulation in parallel comprises one or more processors and a multi-rate circuit simulation module controlled by the one or more processors; the multi-rate circuit simulation module comprises logic configured to partition the circuit into a plurality of partitions, wherein each partition is represented by a set of linear differential equations, logic configured to determine a simulation time step for each partition of the plurality of partitions, logic configured to group the plurality of partitions into multiple groups, where each group includes one or more partitions having simulation time steps within a predefined range of each other, and logic configured to solve the multiple groups with their corresponding simulation time steps in parallel.

In yet another embodiment, a system for performing multi-rate circuit simulation in parallel comprises means for partitioning the circuit into a plurality of partitions, wherein each partition is represented by a set of linear differential equations, means for determining a simulation time step for each partition of the plurality of partitions, means for grouping the plurality of partitions into multiple groups, wherein each group includes one or more partitions having simulation time steps within a predefined range of each other, and means for solving the multiple groups with their corresponding simulation time steps in parallel.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

Like numbers are used throughout the figures.

DESCRIPTION OF EMBODIMENTS

Methods and systems for multi-rate parallel circuit simulation are provided. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 1:
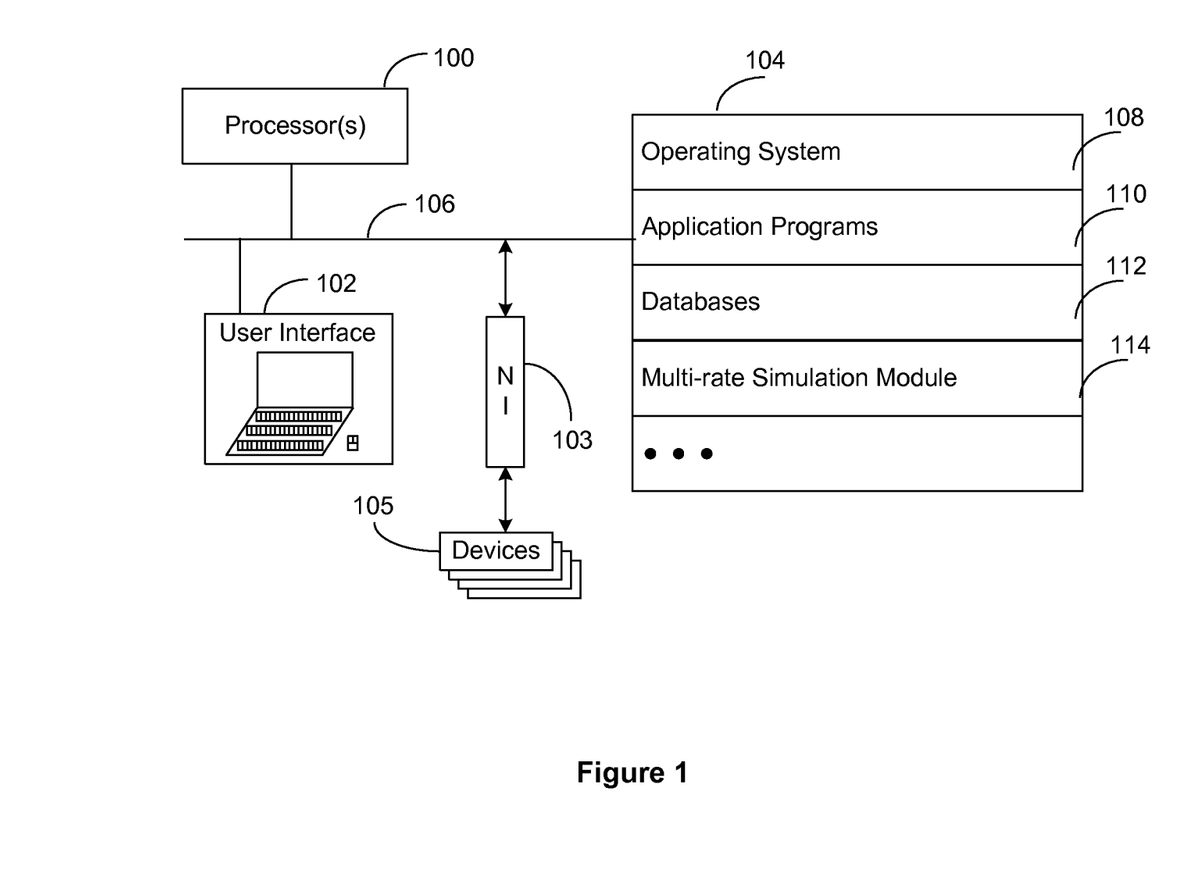
FIG. 1 illustrates a system for implementing methods of performing multi-rate circuit simulation in parallel according to some aspects of the present disclosure.

FIG. 1 illustrates a system for implementing methods of performing multi-rate circuit simulation in parallel according to an embodiment of the present disclosure. In one embodiment, the methods for performing multi-rate circuit simulation in parallel may be implemented using a computer system. The computer system may include one or more graphics processing units (GPUs) and/or central processing units (CPUs) 100 (hereinafter referred to as processor(s) for short), at least a user interface 102 for displaying computation results and waveforms, a memory device 104, a system bus 106, and one or more bus interfaces for connecting the GPUs/CPUs, user interface, memory device, and system bus together. The computer system also includes at least one network interface 103 for communicating with other devices 105 on a computer network. In alternative embodiments, certain functionalities of the method and system may be implemented in one or more application-specific integrated circuits (ASICs) or field-programmable gate arrays (FPGAs), thereby reducing the role of the GPU/CPU.

The memory device 104 may include high-speed random-access memory and may also include non-volatile memory, such as one or more magnetic disk storage devices. The memory device may also include mass storage that is located remotely from the GPUs/CPUs. The memory device preferably stores:

an operating system 108 that includes procedures for handling various basic system services and for performing hardware-dependent tasks;

application programs 110 for performing other user-defined applications and tasks, such as circuit simulations and device evaluations;

databases 112 for storing information of the integrated circuit, the databases include data structures, device models, and matrices;

multi-rate simulation module 114 configured to improve efficiencies of circuit simulations.

The databases, the application programs, and the program for implementing methods of performing multi-rate circuit simulation in parallel may include executable procedures, sub-modules, tables, and other data structures. In other embodiments, additional or different modules and data structures may be used, and some of the modules and/or data structures listed above may not be used.

Figure 2:
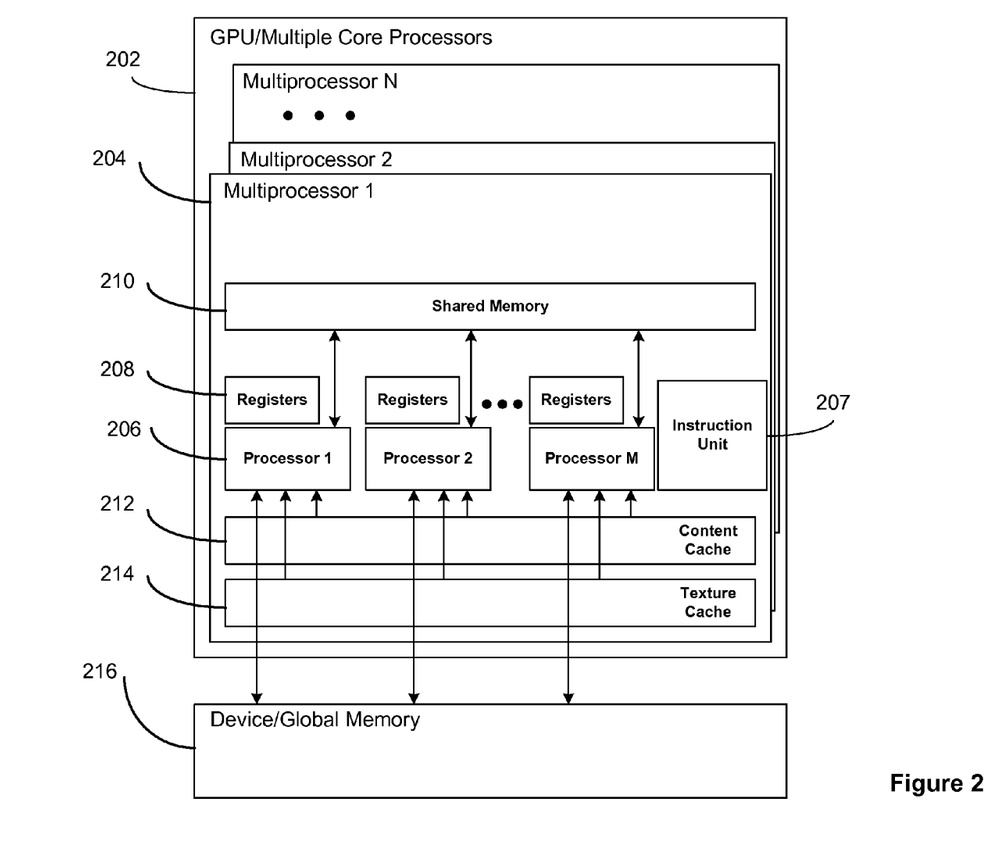
FIG. 2 illustrates an exemplary architecture of a multiple core processor unit according to some aspects of the present disclosure.

FIG. 2 illustrates an exemplary architecture of a multiple core processor (or graphics processor) unit according to some aspects of the present disclosure. As shown in FIG. 2, each GPU includes N multiprocessors. Each multiprocessor 204 further includes M processors 206 and an instruction unit 207. Each processor has its own registers 208. All the processors 206 in one multiprocessor 204 share a block of shared memory 210. All the processors share the same set of constant cache 212 and texture cache 214 memories. They can also access the data in device memory 216, which is also referred to as the global memory.

In this example, each multiprocessor 204 has a block of shared memory. Accessing data from the shared memory 210 is much faster than accessing data from the device (global) memory 216. For this reason, one approach to increase computational efficiency is to load the data from the global memory 216 to the shared memory 210, perform much of the computations/manipulations using the shared memory 210, and then write back the results from the shared memory 210 to the global memory 216.

Figure 3:
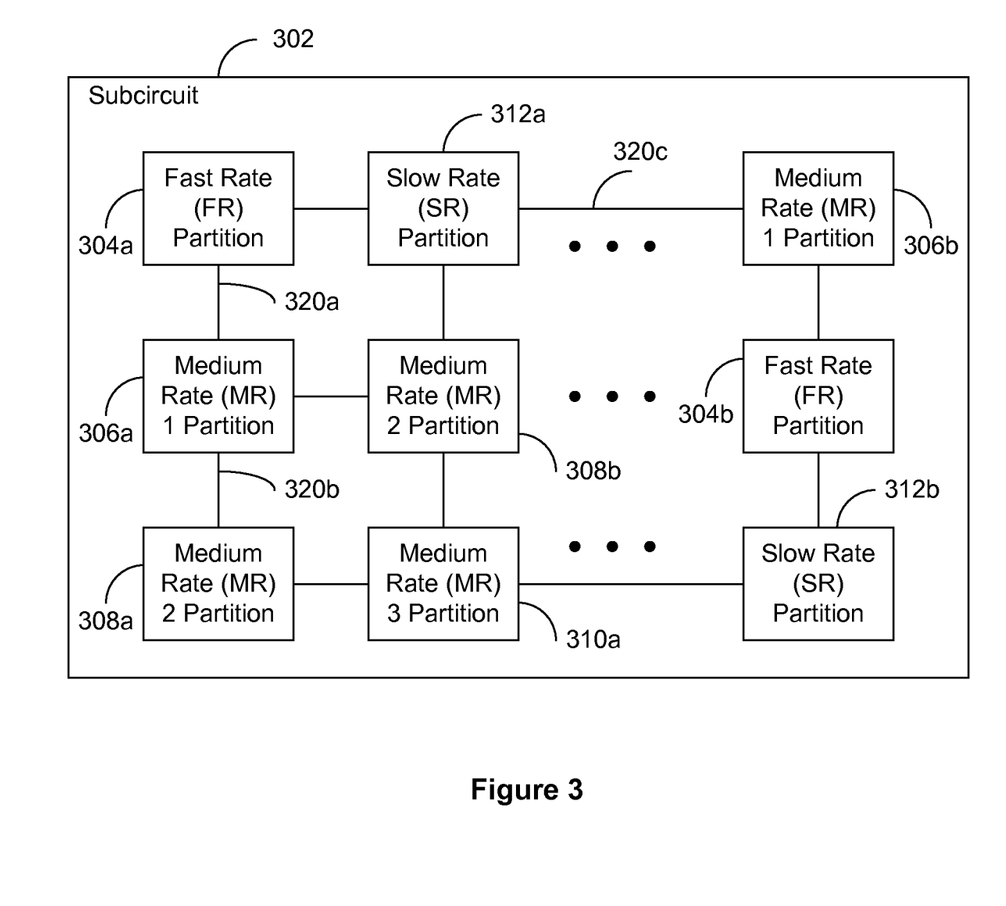
FIG. 3 illustrates a method of partitioning a circuit into devices with multiple rates of simulation according to some aspects of the present disclosure.

FIG. 3 illustrates a method of partitioning a circuit into partitions with multiple rates of simulation according to some aspects of the present disclosure. As shown in FIG. 3, subcircuit 302 may be partitioned into multiple partitions based on the rate of simulation a partition may be simulated. In this example, subcircuit 302 may include fast rate partitions, medium rate partitions and slow rate partitions. For example, partitions 304a and 304b are fast rate partitions; partitions 312a and 312b are slow rate partitions. In some implementations, the medium rate partitions may be further divided into different groups based at least in part on the different rates that may be used for solving such partitions during simulation. For example, partitions 306a and 306b may have medium rate 1; partitions 308a and 308b may have medium rate 2; and partition 310a may have medium rate 3. Each of such medium rate partitions may be solved in accordance with their respective rates during simulation. The partitions may be connected (or coupled) to each other, represented by links 320a, 320b, 320c, etc.

Figure 4A:
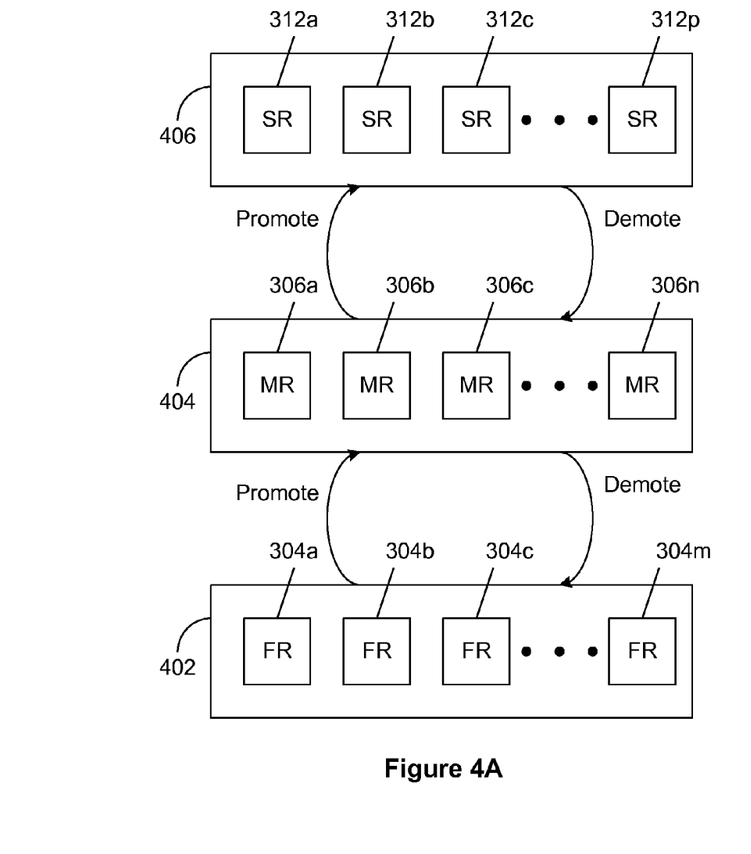
FIG. 4A illustrates a method of grouping devices into groups for different rates of simulation according to some aspects of the present disclosure.

FIG. 4A illustrates a method of grouping partitions into groups for different rates of simulation according to some aspects of the present disclosure. In the example shown in FIG. 4A, for simplicity of illustration, only three groups are shown, namely the fast rate group 402, medium rate group 404, and slow rate group 406. According to aspects of the present disclosure, different numbers of groups may be arranged according to the number of rates, for example thousands of rates that may be used to solve the subcircuit 302 under simulation. Each group may include one or more partitions to be solved using the corresponding simulation rate assigned to that group. For example, group 402 may include partitions 304a, 304b, 304c, 304m, etc., and these partitions can be solved at a fast rate. Similarly, group 404 may include partitions 306a, 306b, 306c, 30bn, etc., and these partitions can be solved at a medium rate. Group 406 may include partitions 312a, 312b, 312c, 312p, etc., and these partitions can be solved at a slow rate.

According to aspects of the present disclosure, a circuit can be dynamically partitioned into different partitions according to certain partition rules. An approach to partition the circuit may include, but not limited to: 1) the conductance coupling between different partitions being sufficiently small; and 2) the capacitance coupling is also considered during dynamic partition. Different partitions may have their corresponding simulation time steps. Performance benefits may be obtained by solving each group of partitions separately with its corresponding simulation time step.

Figure 4B:
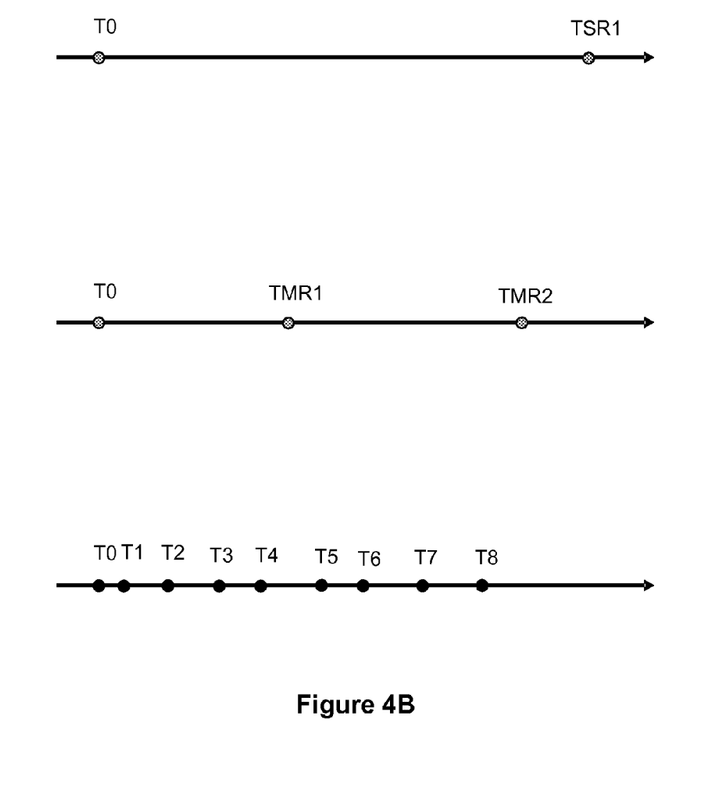
FIG. 4B illustrates an exemplary representation of different rates of simulation according to some aspects of the present disclosure.

FIG. 4B illustrates an exemplary representation of different rates of simulation according to some aspects of the present disclosure. As shown in FIG. 4B, a typical situation that two nodes may be partitioned as two partitions with different time step. The partitions can be separately solved when their coupling is sufficiently small. For $$\begin{bmatrix} A_{FR,FR} & C_{FR,MR} \\ C_{MR,FR} & A_{MR,MR} \end{bmatrix} * \begin{bmatrix} V_{FR} \\ V_{MR} \end{bmatrix},$$

the C(FR,MR)*V(MR) and C(MR, FR)*V(FR) may be close to 0. The following boundary check may be performed to check the validity of the above condition.

According to aspects of the present disclosure, the method to form the various groups may be based on, but not limited to, the computation efficiency at the corresponding simulation rates and the amount of parallelism that may be achieved at the corresponding simulation rates of the groups. For example, one approach to achieve parallelism is to have the number of groups of different simulation rates be equal or greater than the number of processors used for the simulation. In another approach, methods of load balancing, which are further described below in association with FIG. 5A and FIG. 5B, may be employed to achieve parallelism. The method monitors the trade-off between the computational efficiency (computation time) and the amount of parallelism in computation (load balancing) to determine the number of groups that may be formed, to determine whether to promote or demote a partition from one group to another group, to determine whether to merge groups together, and to determine whether to split a group into multiple groups. For example, if a partition that may be simulated at a rate hundreds of times faster than other partitions in its current group, it may be desirable to move the partition into another group and simulating the partition in that group. On the other hand, if a partition that may be simulated at a rate 1.2 times faster than other partitions in its current group, it may be desirable to keep the partition in the same group for simulation, especially if parallelism may be achieved, i.e. simulating the partition may be conducted in parallel with the simulation of other partitions. In determining whether to split or merge a partition with respect to a group, the method continuously monitors the trade-off between the amount of time that would have saved by keeping the partition in a group versus the amount of time that would have lost by moving the partition to another group for simulation.

Figure 5A:
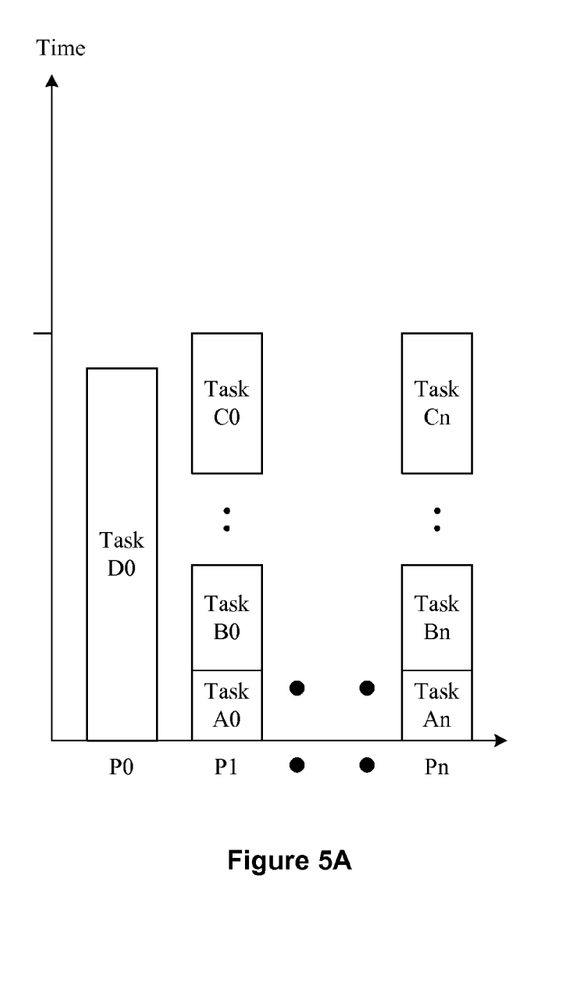
FIG. 5A illustrates a method of performing dynamic load balancing in circuit simulation according to some aspects of the present disclosure.

FIG. 5A illustrates a method of performing dynamic load balancing in circuit simulation according to some aspects of the present disclosure. In the exemplary implementation shown in FIG. 5A, employing the method of dynamic load balancing, P0 (processor 0) may be assigned to process Task D0, P1 (processor 1) may be assigned to process Task A0, Task B0, Task C0, and etc.; and Pn (processor n) may be assigned to process Task An, Task Bn, Task Cn, etc. In other words, the tasks are assigned to the processors according to the amount of duration (time) of processing for each task. In this example, with load balancing, all processors finished their assigned task by time T2, which reduces the amount of idle time each processor may have to wait for another processor to finish one or more large tasks. Thus, with dynamic load balancing, there can be less number of processors being idle waiting for other processors to finish processing their assigned tasks, and there can be less amount of waiting time, in this case the waiting time of P0, for the one or more processors.

Note that for simplicity of illustration, the simulation tasks in examples of FIG. 5A are labeled using alphabets such as A0, B0, C0, and D0. These tasks are associated with their corresponding partition(s), and the partition(s) may determine the dependencies among the tasks. The labeling of the tasks does not suggest or limit the order these tasks would be performed in simulation. According to aspects of the present disclosure, these tasks may be performed in any order based on various factors, including but not limited to: duration of the tasks, the availability of the processors, and activities of the circuit represented by the partitions under simulation.

According to some aspects of the present disclosure, the method of dynamic load balancing identifies an optimal order for processing the simulation tasks. In some implementations, computation time of each instance/partition and its corresponding block matrix may be measured. Note that the computation time of each instance/partition may be changing because of the activities within each of the matrices, for example each instance/partition may have different model evaluation time, load model time, and solve model time. In addition, based on the changes of the simulation environment, certain processing steps may be bypassed for some parts of the matrix. As a result, computation time of the matrices (processing tasks) may change over time. Simulation efficiency may be improved by balancing the load of processing or computation dynamically.

For example, if a task takes 100 seconds to solve, and the other tasks take 1 or 2 seconds to solve. If there are lots of the smaller 1 or 2 second tasks, it would be more efficient to work on the 100 second task first by one processor, and assigned other smaller tasks to be processed by other processors. If the 100 seconds task were being processed last, other processors would have to wait longer before they can move on to process tasks in the next (higher) level. This method of load balancing is beneficial even when the circuit may be static, i.e. there is no dynamic change of circuit activities. Note that in this example the tasks are order from large (requires longer computation time) to small (requires less computation time). The longest task (or the biggest task) is being worked on first. This approach gives a better chance that other tasks may be finished before the longest task is finished.

As indicated above, the computation time of each task may change dynamically over time. Conditions that may cause changes in computation time include but not limited to: changes of activity levels of the circuit over time and changes of stimuli of circuit activities over time. For example, some portions of a circuit may be latent that do not need model evaluation and/or matrix solving. In some other scenarios, the pattern of circuit activities may change over time, which may cause the corresponding matrices to be harder or easier to solve during simulation, which cause the computation time of the corresponding matrices to change over time. In some implementations, the method performs atomic level timing transactions from the processors to measure the computation time of each node of the circuit under simulation. Then, the method may periodically order the computation/processing tasks. In other implementations, measurement of circuit activities may be performed periodically. In some other implementations, the processors may be configured to measure the time required to perform various simulation tasks according to a predetermined simulation period, such as every ten time steps or every one hundred time steps. Such measurements may be performed atomically or non-atomically.

Figure 5B:
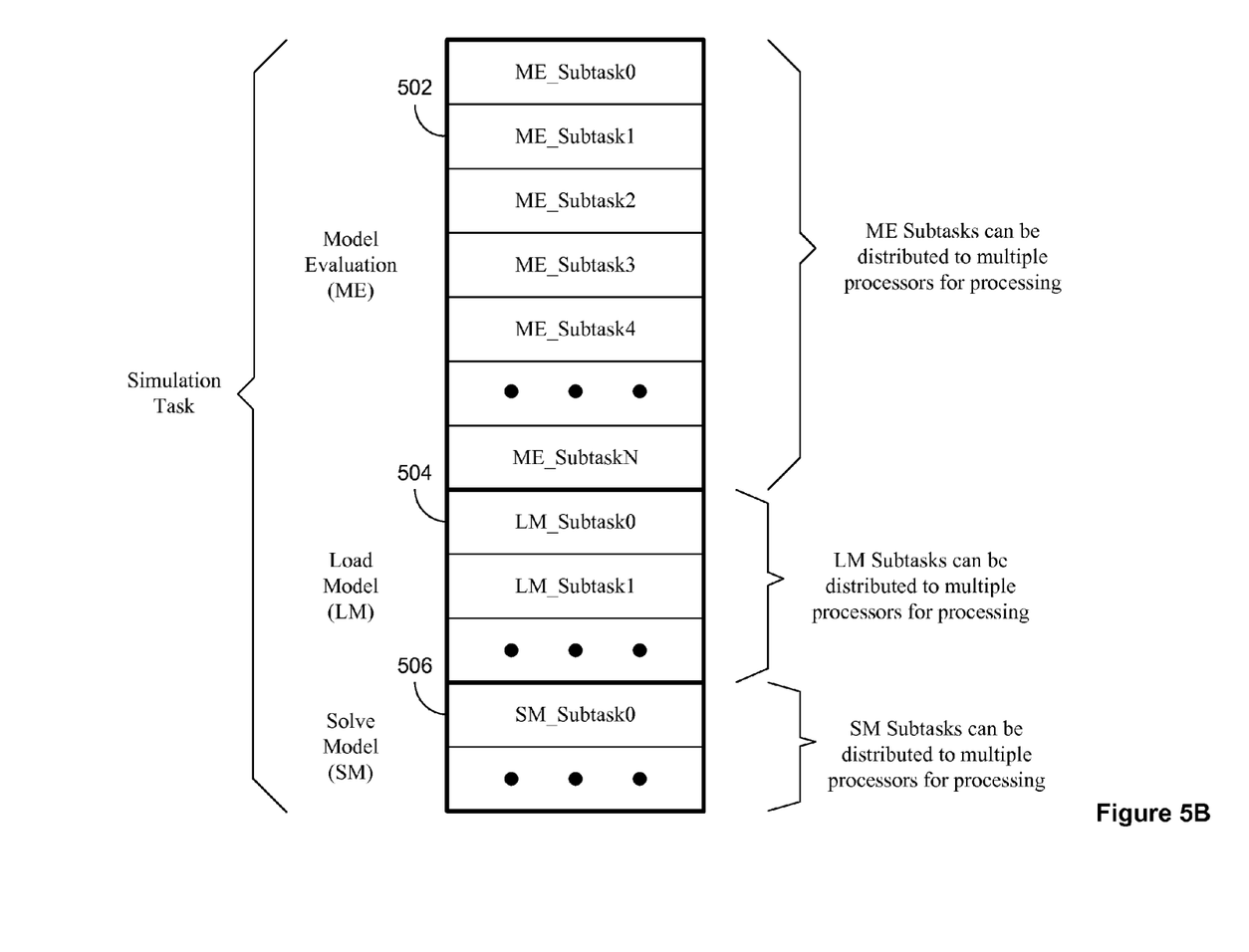
FIG. 5B illustrates another method of performing dynamic load balancing for circuit simulation according to some aspects of the present disclosure.

FIG. 5B illustrates another method of performing dynamic load balancing for circuit simulation according to some aspects of the present disclosure. As shown in FIG. 5B, an exemplary simulation procedure may be described in three steps, model evaluation (ME) 502, load matrix (LM) 504, and solve matrix (SM) 506. In this example, it takes the longest time to perform the model evaluation task, then the load model task, and it takes the least amount of time to perform the solve model task.

According to some aspects of the present disclosure, each of the ME, LM, and SM tasks may be further partitioned to their corresponding sub-tasks. For example, the model evaluation task 502 may be further partitioned into ME_Subtask0, ME_Subtask1, ME_Subtask2, ME_Subtask3, ME_Subtask4, ME_SubtaskN, and etc. The load model task 504 may be further partitioned into LM_Subtask0, LM_Subtask1 and etc. The solve matrix task 506 may be further partitioned into SM_Subtask0 and etc. These subtasks may then be distributed to multiple processors to be processed in parallel. Note that the partitioning may be guided using the measured subtask time, and the matrix may be repartitioned based on the subtasks to improve load balancing during simulation. In the example shown in FIG. 5B, after having partitioned the ME, LM and SM tasks into their corresponding subtasks, if one processor is partially through processing some of the subtasks of ME 502, another processor may take one or more of the remaining subtasks for processing.

Note that the above technique of subtask distribution and sharing among multiple processors may apply to the processing of load matrix and solve matrix tasks as well. For example, to perform a load matrix task, one approach is to go through the model evaluation outputs and load each value into the matrix one by one. This approach may encounter conflicts in accessing the computer memory, which can incur a large overhead in order to avoid writing the same memory location. An alternative approach is to go through each of the matrix location, read the corresponding outputs of model evaluation that may contribute to the value of the matrix location, and add the value of each output of model evaluation obtained to the matrix location.

According to aspects of the present disclosure, simulation tasks such as ME, LM, SM may be considered as major tasks and such major tasks may be further divided into multiple subtasks, as shown in FIG. 5B. One approach to distribute and share the processing of major tasks is to periodically measure the time required to perform the major tasks and then balance the processing load accordingly.

Another way to distribute and share the processing of major tasks is when one of the processors is idle. If there are major tasks waiting to be processed, such major tasks may be permanently taken for processing. Note that, "taking" a major task means the processor that takes the major task into its processing queue would be responsible for processing the major task being taken until that major task may be taken by another processor. According to aspects of the present disclosure, major tasks may be taken permanently; while subtasks may be taken (distributed and shared for processing) temporarily, which means the ownership of the subtasks still belongs to the processor of the major task which the subtask is associated with. In the way, the order of the processing and the relationship among the different subtasks may be maintained.

Figures 6, 7:
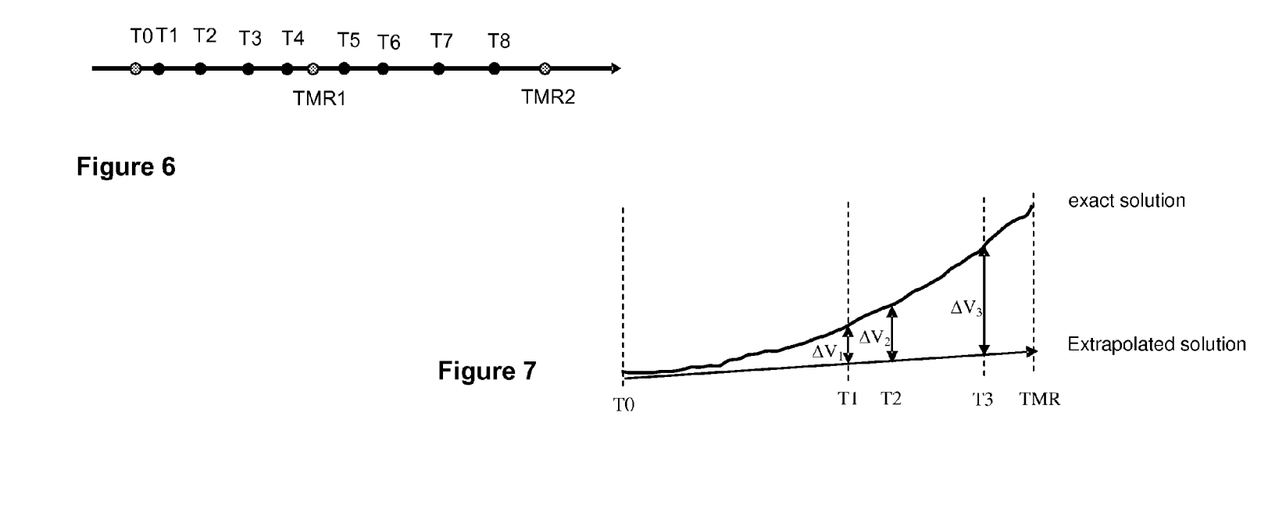
FIG. 6 illustrates an exemplary representation of combined fast rate and medium rate of simulation according to some aspects of the present disclosure.
FIG. 7 illustrates boundary condition check between different groups having different rates of simulation according to some aspects of the present disclosure.

FIG. 6 illustrates an exemplary representation of combined fast rate and medium rate of simulation according to some aspects of the present disclosure. For simplicity of illustration, one fast rate (FR) and one medium rate (MR) are used as an example. As shown in FIG. 6, the method may perform multi-rate circuit simulation using the following exemplary steps.

In step 1, at T0, a fast rate time point T1 is proposed. Group the partitions into different rates according to the rules that, including but not limited to: 1) partition Step>16.0*TFR; 2) partition boundary node step>Factor*16.0*TFR, where TFR=(T1−T0). Then the MR time point TMR1 is proposed at T0. The Factor is a number smaller than 1.0. It depends on coupling of boundary node.

$$\text{Factor} = \frac{A_{ij}}{A_{ii}},$$

where $A_{ij}$ is coupling and $A_{ii}$ is the diagonal entry in the stamping matrix. If $A_{ij}$ is much smaller than $A_{ii}$, it means the partition group step is dominated by itself instead of its boundary partition group.

In step 2, the method solve for TMR1. First, the method extrapolates boundary FR from T0 to TMR1, extrapolate MR from T0 to TMR1, interpolate slower rate. Second, the method performs dynamic partition every NR iteration. In consideration of performance, the dynamic partition is an incremental procedure. It includes merge/split event. The merge event happens when the coupling of two partitions becomes strong and meets the criteria to be one partition. Those two partitions may be merged into one new partition. The rate of new partition follows the rate of faster partition. The split event happens when the coupling of two nodes in one partition becomes weak and meets the criteria to be two partitions. Those two new split partitions have their own rate which can be different as original partition. One situation is that one partition follows original partition's rate and the other partition meets slower rate. If a MR partition merges with a FR partition, demote it to FR. If a MR partition merges with a slower rate/dead rate, demote the slower rate partition to current rate. MR time point allows split event. In one approach, transfer function may be evaluated/loaded with the devices connect to MR. In this example, the MR partitions partition may change. With this approach, the dynamic partition can be an iteration delayed as it is compared to evaluation. Third, the method conducts boundary check. If boundary check fails, the associated partitions need adjust their rate to the fastest rate among those partitions accordingly. If the partitions have the same rate, they may be demoted to either current solving rate or faster rate. For example, if the boundary condition between MR and FR fails, demote the MR to FR. If the boundary condition between MR and DR fails, demote the DR to MR. If the boundary condition between MR and MR fails, demote all of them to FR. There are three types of boundary check which are further described in the following sections. Fourth, the method solves for all MR partitions together. Next, if NR failed, demote the NR failed partitions to FR and the MR/DR partitions has strong coupling with the NR failed partitions. If LTE failed, demote the LTE failed partitions to FR and the MR/DR partitions has strong coupling with the LTE failed partitions.

In step 3, the method solves for T1 (TFR). First, the method extrapolates FR from T0 to T1. Interpolate boundary MR node solution from TMR1 to T1. Second, the method performs dynamic partition. The changed partitions caused by merge/split events need adjust their rate to the fastest rate among the original partitions. If a slower rate (MR/DR) partition is merged with FR partition, demote the slower rate partition to FR. Third, the method conducts boundary check. If boundary check fails, the associated partitions need adjust their rate to the fastest rate among those partitions accordingly. Demote the boundary failed slower rate to FR. Fourth, the method performs NR solving of all FR partitions together. If NR failed/LTE failed, shrink the time step and redo NR.

In step 4, the method performs immediate MR promotion to achieve higher MR ratio. In one approach, the method checks all FR partitions and promotes partitions that meet the MR criteria from T1 to TMR1. The criteria can be different with MR promotion at T0. At T0, the MR candidate partition step can be larger than (TMR1−T0). At T1, the MR candidate partition step changes to be larger than (TMR1−T1). These partitions may need to pass boundary check with other rates partitions and the original MR partitions promoted at T0 because the immediate MR partitions can be solved independent of the original MR partitions.

In step 5, the method solves TMR1 for immediate promotion partitions similar as step 2.

In step 6, after T5 is solved and accepted, TMR1 can be accepted then. At T5, promote FR partitions that meet MR criteria. Combine the new promoted partitions and the original MR partitions that have been solved at TMR1.

In step 7, the method solves for TMR2. For the new promoted partitions, as they have not been solved at TMR1, they don't have the history at TMR1. The history includes solution, CurrentRHS and ChargeRHS. The solution can be obtained by interpolated Solution (T4) and Solution (T5). Based on the interpolated solution, locally evaluation may be performed to get the CurrentRHS and ChargeRHS.

In step 8, the method repeats step 2 to step 6 to finish the whole simulation.

According to aspects of the present disclosure, the build history may include solution, CurrentRHS and ChargeRHS. The history build may occur during promotion or demotion. The promoted or demoted partitions have not been solved with other nodes in a past time point. In some implementations, the following two situations may be used.

First, when solving FR, a MR partition is demoted to FR. For example, in FIG. 6, an MR partition may be demoted when solving T3. The history may be used at T2. For the partition solution, Solution (T2)=Interpolate (Solution (T0), Solution (TMR1)). To evaluate the devices connect to this partition, the partition solution and its boundary solution may be used. The boundary solution: 1) FR, it can be a past solution. 2) MR, interpolation (T0, TMR1, T2).

Second, with respect to promotion at T5, the newly promoted partitions may be combined with the original MR partitions to be solved together. The original MR partitions may have history at TMR1 but the new promoted partitions may not have that. The solution of (TMR1)=interpolate (T4, T5). Boundary node solution: 1) FR, interpolation (T4, T5, TMR1). 2) MR, it is in past solution. Evaluate the associated devices to calculate CurrentRHS and ChargeRHS.

According to aspects of the present disclosure, a MR promotion may be performed as follows. At T0, some nodes may be promoted from FR to MR and a MR time point (TMR1) may be proposed. During T0 to TMR1, there may be some other nodes can be promoted to TMR1. To achieve better MR ratio, this type of promotion may be performed.

In some implementations, one approach is to merge the new immediate promoted nodes to the old MR nodes and resolve them together. This approach can lose the MR meaning as the MR is solved at every FR time point. Another approach is to solve the new immediate promoted nodes separately with the old MR nodes. The boundary between them may need to pass the boundary condition check.

According to aspects of the present disclosure, a MR point can be accepted if its boundary has been solved/accepted and the boundary check based on accepted solution passes. For example, in FIG. 2, the TMR1 can be accepted only after T5 has been solved.

According to aspects of the present disclosure, there are several methods to perform the FR/MR time point alignment. In some implementations, the method may perform the FR/MR time point alignment using the following exemplary steps.

In step 1, the method aligns MR to FR. In that case, the history may be rebuilt at FR for all MR nodes. The overhead may be high.

In step 2, the method aligns FR to MR. In FIG. 6, a FR point at TMR1 may be proposed after T4 is solved/accepted. It may decrease the FR time step and results in #FR time step increase.

In step 3, the method deals with the situation that FR and MR may not be aligned. Once FR exceeds MR, a new promotion may be performed. For new promoted nodes, interpolate the solution from TFR to TMR and build the history. In some implementations, the following alignment situations may be observed. Note that T0 can be an alignment point of FR and MR.

First, suppose a node trace is T0, T1, T2, T3, T4, T5, or TMR2 (promotion), the history of this node may not be available at TMR1, which need be used to solve TMR2. As both T4 and T5 are solved as FR, the solution of this node can be interpolated to TMR1 and build its TMR1 history based on the interpolated solution.

Second, suppose a node trace is T0, TMR1 (promotion & solving & accept), TMR2 (solving & reject & demotion). It means TMR1 is accepted after T5 has been solved. When the node is demoted from TMR2, it can't be demoted to T5 because the node has not been solved between TMR1 and T5. The node can be demoted at T4 and can be re-solved at T5. After T5 is accepted, TMR2 can be re-solved based on the new FR boundary. The T5 and TMR2 can be iteratively solved until T5 is accepted and TMR2 demotion may not happen in general. Otherwise, the cost of iteratively solving T5 and TMR2 may be too high and which may lose performance benefits.

According to aspects of the present disclosure, boundary check may be performed in the following exemplary approaches. First, a partitioner considers main conductance rather than capacitance. Second, the amplifier may occur through conductance path instead of capacitance path. Based on the first point, current of FR flow into MR for one partition may be considered and the partition's neighbors may not need to be taken into consideration.

Third, the basic approach of boundary condition is to check the solution violation of MR during solving FR. FIG. 7 illustrates boundary condition check between different groups having different rates of simulation according to some aspects of the present disclosure. The straight line represents the extrapolated solution of FR node. The curve represents the exact solution. When solving FR at T1 and T2, the demotion may not happen because $\Delta V_1$ and $\Delta V_2$ may be smaller than a threshold, i.e., it doesn't meet the solution violation criteria. Once the boundary check passes at T1 and T2, the MR group's solution may then be accepted. When solving FR at T3, the solution violation $\Delta V_3$ is bigger than the threshold. It means the boundary solution is not satisfied if solving MR at T3. Based on this, the FR's boundary MR groups need to be demoted to FR and resolving them at T3 together.

Fourth, one approach is to estimate the impact of FR to MR, which may also be referred to as the sensitivity of FR to MR. It is used when solving MR. The boundary FR extrapolated solution and according boundary current may be available. If the boundary current is close to 0, or the boundary current doesn't change (even the boundary FR extrapolated solution changes a lot), the MR can be solved correctly because the boundary condition doesn't change. To avoid MR demotion and achieve further higher MR ratio, the previous condition may be too conservative. It means the boundary current may not be small and the change may not be small. In this situation, if the current impact on the MR voltage is small, the MR solved at TMR may be kept and its accuracy may be considered acceptable. In this approach, it may mean the MR voltage may not be sensitive on the boundary current. To calculate the sensitivity, one approach is to solve the following equations:

$$A * dV = dI,$$

where A is stamping matrix, dI is the boundary current, dV represents MR voltage to be solved. If each entry of dV is smaller than a threshold (for example, dV<0.001*reference, which is the NR converged condition), this partition may be considered as not sensitive on the boundary current. The dI may be calculated by A*dV, where A is the stamping matrix and dV is difference of MR boundary (FR nodes) between extrapolation and last accepted voltage.

This check may be performed on a partition-by-partition based on the $1^{st}$ and $2^{nd}$ assumptions. Note that in this approach: 1) the partition stamping matrix inverse may be used. It may be natural there for top UD; 2) for multi-UD flow, the leaf UD combines a rate group partitions into one. The factorization may be based on the combined partition. The inverse of each partition may not be available. An approximation may use $dV_j = (G_{j,i}/G_{j,j}) * dV_i$, where $G_{j,i}$ and $G_{j,j}$ are coupling between node i and node j, total conductance of node i. The node i is FR node and node j is MR node. The $dV_i$=interpolation−exact solution. If $dV_j$ is smaller than the threshold, the boundary condition may be considered to be passed.

Fifth, the method performs boundary diagnostic. With respect to TMR, based on the extrapolated boundary solution V(FR), the MR system can be solved to obtain the solution V(MR). For each boundary node, add a noise dV(FR), (for example 0.01V), V'(FR)=V(FR)+dV(FR), resolving the MR system to get a new MR solution V'(MR). The sensitivity of FR to MR can be (V(MR)−V'(MR))/dV (FR). With respect to TFR, based on the interpolated boundary solution V(MR), the FR system can be solved to obtain the solution V(FR). For each boundary MR node, add a noise dV(MR), (for example 0.01V), V'(MR)=V(MR)+dV (MR), resolving the FR system to get a new FR solution V'(FR). The sensitivity can be: (V(FR)−V'(FR))/dV(MR).

Figure 8:
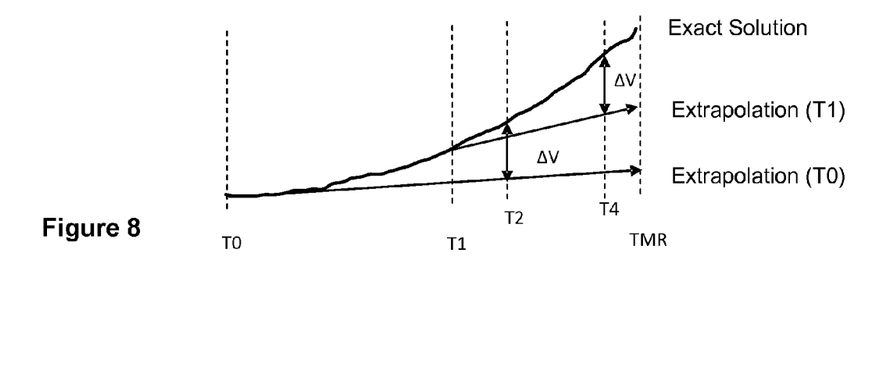
FIG. 8 illustrates a method of solving boundary conditions between different rates of simulation according to some aspects of the present disclosure.

FIG. 8 illustrates a method of solving boundary conditions between different groups having different rates of simulation according to some aspects of the present disclosure. According to aspects of the present disclosure, two kinds of MR nodes may be in one rate, such as promoted at TMR, and immediately promoted at TFR. One FR node may be boundary of the above two type MR. For example, in FIG. 6, for the MR promoted at T0 to TMR1, the boundary extrapolation may be from T0 to TMR1. For the immediate promoted at T3 to TMR1, the boundary extrapolation may be from T3 to TMR1. When they share one FR boundary node, the FR may need to keep those two extrapolations.

According to aspects of the present disclosure, the two extrapolations may be different because different solution at T0 and T3. To keep implementation simple and save memory, the extrapolation at immediate promotion may be ignored and the one at T0 may be reused. In that case, there is an extra difference introduced for the immediate promotion boundary check at T4 by this simplification. The delta solution can be computed as: Interpolation (T0, TMR1, T4)−interpolation (T3, TMR1, T4). It may cause some demotion to happen unnecessarily. As the demotion does not have accuracy lost, this extrapolation method may still guarantee the accuracy. It can be shown in FIG. 8. If the extrapolation is from T1 to TMR, the demotion happens at T4 because the $\Delta V$=Solution (T4)−Interpolation (T1, TMR, T4) can be larger than a threshold at T4. Using the extrapolation from T0 to TMR, the demotion may come earlier at T2 because $\Delta V$=Solution (T2)−interpolation (T0, TMR, T2) can be too large.

According to aspects of the present disclosure, boundary device evaluation may be conducted as follows. One exemplary implementation is to decrease the overhead of boundary device evaluation using the following exemplary approaches. First, if the device connection is: VDD/GND, MR, the device may not need to be evaluated at FR. After this device is evaluated at TMR, the coupling current may be stored. Then the couple current at TFR can be interpolated. According to aspects of the present disclosure, as the MR nodes are solved at TMR and the VDD node also can be treated as being solved at TMR; thus between T0 and TMR, the current can be interpolated. In some implementations, between two solved/accepted time points, the current may use interpolation. Second, for other situations, the boundary device evaluation may be controlled by determining whether it can be bypassed.

According to aspects of the present disclosure, maximum device bypass may be performed using the following exemplary approaches. First, when solving TMR, a device may leave bypass, but it can stay in bypass when back to solve TFR. In one implementation, the method may keep the device history of FR. The history includes inactive matrix/RHS (global bypass), local matrix/RHS (local bypass). A temporary matrix/RHS may be used at TMR. For global bypass, the complexity may be related; and the nodes connect to device leave global bypass at TMR. For local bypass, a temporary local matrix/RHS can be allocated for each thread. According to aspects of the present disclosure, one way to verify this flow is to randomly demote MR, the local/global bypass ratio keeps unchanged. Second, the inactive RHS may be updated according to current solution and last accepted time point solution.

Third, the device that leaves bypass may be checked at every iteration. In some situations, the device leaves bypass at TFR (T1<TFR<TMR1). The local matrix/RHS, inactive matrix/RHS can then be updated. For FR internal device, the update may be the same as normal flow. For FR-MR boundary device, the FR node inactive RHS may be updated using FR solution pair. For example, if a boundary device leaves bypass at T4, the solution pair can be: N1 (Solution (T4), Solution (T3)), N2 (Solution (T4), Solution (T3)). The MR node inactive RHS can be updated using MR solution pair: N1 (Solution (T4), Solution (T1)), N2 (Solution (T4), Solution (T1)). Note that the update is configured to avoid the MR inactive RHS update at TFR.

In some other situations, the device leaves bypass at TMR. If the device is FR-MR boundary device, the update target is the temporary global inactive matrix/RHS and local matrix/RHS. The solution pair can be current solution and last time point solution. For normal MR solving, the last time point is T1. For immediate promotion MR, the last time point is the point that triggers the MR promotion. If the device is a MR internal device, it may leave bypass and save current evaluation result as history. This is because it may incur additional resources to keep different rate history for one device. So if an internal MR device becomes a boundary device at the next FR point, it may lose the chance to keep bypass. From this point of view, MR demotion may be avoided in such situations.

Fourth, the device can enter bypass when its fastest terminal rate is accepted. In some situations, the device enters bypass at TFR (T1<TFR<TMR1). For a FR internal device, the update can be the same as normal flow. For a FR-MR boundary device, the FR node inactive RHS may be loaded as normal situation. For a MR node, besides the device loading to inactive RHS, an extra update may be performed using current solution and last MR accepted solution. In some other situations, the device enters bypass at TMR. No further action may be taken when solving TMR. When the TMR is accepted, then the device local matrix may be used to update inactive matrix/RHS.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A computer implemented method of performing multi-rate circuit simulation in parallel, comprising:
    partitioning the circuit into a plurality of partitions, wherein each partition is represented by a set of linear differential equations;
    determining a simulation time step for each partition of the plurality of partitions;
    grouping the plurality of partitions into multiple groups, wherein each group includes one or more partitions having simulation time steps within a predefined range of each other; and
    solving the multiple groups with their corresponding simulation time steps in parallel, comprising solving for boundary conditions between the fast group and the medium group, demoting a first partition from the medium group to the fast group in response to lack of convergence in solving for the first partition with the medium simulation time step, and promoting a second partition from the fast group to the medium group in response to convergence in solving for the second partition has been stable for a predetermined number of simulation cycles.

2. The computer implemented method of claim 1, wherein the partitioning the circuit into a plurality of partitions comprises:
    partitioning based at least in part on coupling between the plurality of partitions being smaller than a predetermined coupling strength.

3. The computer implemented method of claim 1, wherein the determining a simulation time step for each partition of the plurality of partitions comprises:
    discretizing the plurality of partitions and the corresponding sets of linear differential equations; and
    for each set of differential equations, determining the simulation time step for solving the set of differential equations.

4. The computer implemented method of claim 1, wherein the multiple groups comprises at least one of:
    a fast group comprising one or more partitions having smallest simulation time steps among the plurality of partitions;
    a slow group comprising one or more partitions having largest simulation time steps among the plurality of partitions; and
    a medium group comprising one or more partitions having medium simulation time steps among the plurality of partitions.

5. The computer implemented method of claim 4, wherein the medium group comprises:
    one or more medium rate groups, wherein each of the one or more medium rate group comprises a different simulation time step.

6. The computer implemented method of claim 1, wherein the grouping the plurality of partitions into multiple groups comprises:
    for a group in the multiple groups,
    creating the group to include one or more partitions having a common simulation time step; and creating the group based on computational time of each partition in the group and computational parallelism of other partitions in the group.

7. The computer implemented method of claim 1, wherein the solving for boundary conditions between the fast group and the medium group comprises:
   solving for a new solution for a partition in the medium rate group using a previous solution for the partition in the medium rate group and a projected solution in the fast rate group.

8. The computer implemented method of claim 1, wherein the solving the multiple groups with their corresponding simulation time steps in parallel further comprises:
   solving for boundary conditions between the slow group and the medium group;
   demoting a third partition from the slow group to the medium group in response to lack of convergence in solving for the third partition with the slow simulation time step; and
   promoting a fourth partition from the medium group to the slow group in response to convergence in solving for the fourth partition has been stable for a predetermined number of simulation cycles.

9. The computer implemented method of claim 8, wherein the solving for boundary conditions between the slow group and the medium group comprises:
   solving for a new solution for a partition in the slow rate group using a previous solution for the partition in the slow rate group and a projected solution in the medium rate group.

10. An apparatus configured to perform multi-rate circuit simulation in parallel, comprising:
    one or more processors;
    a multi-rate circuit simulation module controlled by the one or more processors; wherein the multi-rate circuit simulation module comprises:
    logic configured to partition the circuit into a plurality of partitions, wherein each partition is represented by a set of linear differential equations;
    logic configured to determine a simulation time step for each partition of the plurality of partitions;
    logic configured to group the plurality of partitions into multiple groups, wherein each group includes one or more partitions having simulation time steps within a predefined range of each other; and
    logic configured to solve the multiple groups with their corresponding simulation time steps in parallel, comprising logic configured to solve for boundary conditions between the fast group and the medium group, logic configured to demote a first partition from the medium group to the fast group in response to lack of convergence in solving for the first partition with the medium simulation time step, and logic configured to promote a second partition from the fast group to the medium group in response to convergence in solving for the second partition has been stable for a predetermined number of simulation cycles.

11. The apparatus of claim 10, wherein the logic configured to partition the circuit into a plurality of partitions comprises:
    logic configured to partition based at least in part on coupling between the plurality of partitions being smaller than a predetermined coupling strength.

12. The apparatus of claim 10, wherein the logic configured to determine a simulation time step for each partition of the plurality of partitions comprises:
    logic configured to discretize the plurality of partitions and the corresponding sets of linear differential equations; and
    for each set of differential equations, logic configured to determine the simulation time step for solving the set of differential equations.

13. The apparatus of claim 10, wherein the multiple groups comprises at least one of:
    a fast group comprising one or more partitions having smallest simulation time steps among the plurality of partitions;
    a slow group comprising one or more partitions having largest simulation time steps among the plurality of partitions; and
    a medium group comprising one or more partitions having medium simulation time steps among the plurality of partitions.

14. The apparatus of claim 13, wherein the medium group comprises:
    one or more medium rate groups, wherein each of the one or more medium rate group comprises a different simulation time step.

15. The apparatus of claim 10, wherein the logic configured to group the plurality of partitions into multiple groups comprises:
    for a group in the multiple groups,
    logic configured to create each group to include one or more partitions having a common simulation time step; and
    logic configured to create the group based on computational time of each partition in the group and computational parallelism of other partitions in the group.

16. The apparatus of claim 10, wherein the logic configured to solve for boundary conditions between the fast group and the medium group comprises:
    logic configured to solve for a new solution for a partition in the medium rate group using a previous solution for the partition in the medium rate group and a projected solution in the fast rate group.

17. The apparatus of claim 10, wherein the logic configured to solve the multiple groups with their corresponding simulation time steps in parallel further comprises:
    logic configured to solve for boundary conditions between the slow group and the medium group;
    logic configured to demote a third partition from the slow group to the medium group in response to lack of convergence in solving for the third partition with the slow simulation time step; and
    logic configured to promote a fourth partition from the medium group to the slow group in response to convergence in solving for the fourth partition has been stable for a predetermined number of simulation cycles.

18. The apparatus of claim 17, wherein the logic configured to solve for boundary conditions between the slow group and the medium group comprises:
    logic configured to solve for a new solution for a partition in the slow rate group using a previous solution for the partition in the slow rate group and a projected solution in the medium rate group.

19. A system for performing multi-rate circuit simulation in parallel, comprising:
    means for partitioning the circuit into a plurality of partitions, wherein each partition is represented by a set of linear differential equations;
    means for determining a simulation time step for each partition of the plurality of partitions;

means for grouping the plurality of partitions into multiple groups, wherein each group includes one or more partitions having simulation time steps within a predefined range of each other; and means for solving the multiple groups with their corresponding simulation time steps in parallel, comprising means for solving for boundary conditions between the fast group and the medium group, means for demoting a first partition from the medium group to the fast group in response to lack of convergence in solving for the first partition with the medium simulation time step, and means for promoting a second partition from the fast group to the medium group in response to convergence in solving for the second partition has been stable for a predetermined number of simulation cycles.

* * * * *